(12) United States Patent
Hsu et al.

(10) Patent No.: US 11,462,626 B2
(45) Date of Patent: Oct. 4, 2022

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Chia-Wei Hsu, New Taipei (TW); Pei Ying Lai, Hsinchu (TW); Cheng-Hao Hou, Hsinchu (TW); Xiong-Fei Yu, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/900,292

(22) Filed: Jun. 12, 2020

(65) Prior Publication Data

US 2021/0126105 A1 Apr. 29, 2021

Related U.S. Application Data

(60) Provisional application No. 62/927,361, filed on Oct. 29, 2019.

(51) Int. Cl.
*H01L 27/088* (2006.01)
*H01L 29/51* (2006.01)
(Continued)

(52) U.S. Cl.
CPC ...... *H01L 29/513* (2013.01); *H01L 21/28158* (2013.01); *H01L 21/3115* (2013.01);
(Continued)

(58) Field of Classification Search
CPC ............ H01L 21/28; H01L 21/3115; H01L 21/28158; H01L 29/40; H01L 29/49;
(Continued)

(56) References Cited

U.S. PATENT DOCUMENTS 6,429,126 B1 8/2002 Herner et al.
6,451,646 B1 9/2002 Lu et al.
(Continued)

FOREIGN PATENT DOCUMENTS

| TW | 201110350 A | 3/2011 |
|---|---|---|
| TW | 201501299 A | 1/2015 |
| TW | 201727761 A | 8/2017 |

OTHER PUBLICATIONS

Hsieh, et al.; Improved Performance And Reliability For Metal-Oxide Semiconductor Field-Effect-Transistor With Fluorinated Silicate Glass Passivation Layer; Applied Physics Letters 96, pp. 022905-1-022905-3 (2010); doi: 10.1063/1.3279140.

*Primary Examiner* — Chuong A Luu
(74) *Attorney, Agent, or Firm* — Slater Matsil, LLP

(57) ABSTRACT

Semiconductor devices and methods which utilize a passivation dopant to passivate a gate dielectric layer are provided. The passivation dopant is introduced to the gate dielectric layer through a work function layer using a process such as a soaking method. The passivation dopant is an atom which may help to passivate electrical trapping defects, such as fluorine.

20 Claims, 9 Drawing Sheets

(51) Int. Cl.
*H01L 21/3115* (2006.01)
*H01L 21/28* (2006.01)
*H01L 29/40* (2006.01)
*H01L 29/78* (2006.01)
*H01L 29/66* (2006.01)
*H01L 29/49* (2006.01)

(52) U.S. Cl.
CPC .......... *H01L 29/401* (2013.01); *H01L 29/517* (2013.01); *H01L 29/66795* (2013.01); *H01L 29/785* (2013.01); *H01L 29/4966* (2013.01)

(58) Field of Classification Search
CPC ......... H01L 29/51; H01L 29/66; H01L 29/78; H01L 29/401; H01L 29/517; H01L 29/785; H01L 29/4966; H01L 29/66795; H01L 21/845; H01L 21/8234; H01L 21/8238; H01L 21/823462; H01L 21/823437; H01L 21/823431; H01L 21/28176; H01L 21/046; H01L 21/28105; H01L 21/823821; H01L 21/2253; H01L 21/31155; H01L 21/04615; H01L 21/768; H01L 21/76859; H01L 27/108; H01L 27/0924; H01L 27/10826; H01L 27/10879; H01L 27/1211; H01L 27/088; H01L 27/0886; H01L 29/4983; H01L 29/66803; H01L 29/7856; H01L 29/7855

USPC .................................................. 438/284, 286
See application file for complete search history.

(56) References Cited

U.S. PATENT DOCUMENTS

| | | |
|---|---|---|
| 8,319,295 B2 | 11/2012 | Collaert et al. |
| 8,492,230 B2 | 7/2013 | Ishikawa et al. |
| 9,508,556 B1 | 11/2016 | Tsai et al. |
| 10,468,258 B1 | 11/2019 | Lin et al. |
| 2008/0164539 A1 | 7/2008 | Collaert et al. |
| 2009/0137117 A1 | 5/2009 | Park et al. |
| 2012/0323008 A1 | 12/2012 | Barry et al. |
| 2013/0113053 A1 | 5/2013 | Lin et al. |
| 2013/0270646 A1 | 10/2013 | Kim et al. |
| 2014/0183666 A1 | 7/2014 | Pramanik |
| 2014/0217483 A1 | 8/2014 | Choi et al. |
| 2015/0132938 A1 | 5/2015 | Ahmed et al. |
| 2016/0225871 A1 | 8/2016 | Cheng et al. |
| 2017/0069737 A1 | 3/2017 | Choi et al. |
| 2017/0110551 A1* | 4/2017 | Lee ............. H01L 29/4966 |
| 2017/0170027 A1 | 6/2017 | Hou et al. |
| 2017/0186868 A1 | 6/2017 | Cheng et al. |
| 2019/0096680 A1 | 3/2019 | Wei et al. |
| 2019/0096681 A1 | 3/2019 | Wei et al. |
| 2020/0098640 A1* | 3/2020 | Savant ............. H01L 21/82345 |

* cited by examiner

SEMICONDUCTOR DEVICE AND METHOD OF MANUFACTURE

PRIORITY CLAIM AND CROSS-REFERENCE

This application claims the benefit of U.S. Provisional Application No. 62/927,361, filed on Oct. 29, 2019 which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
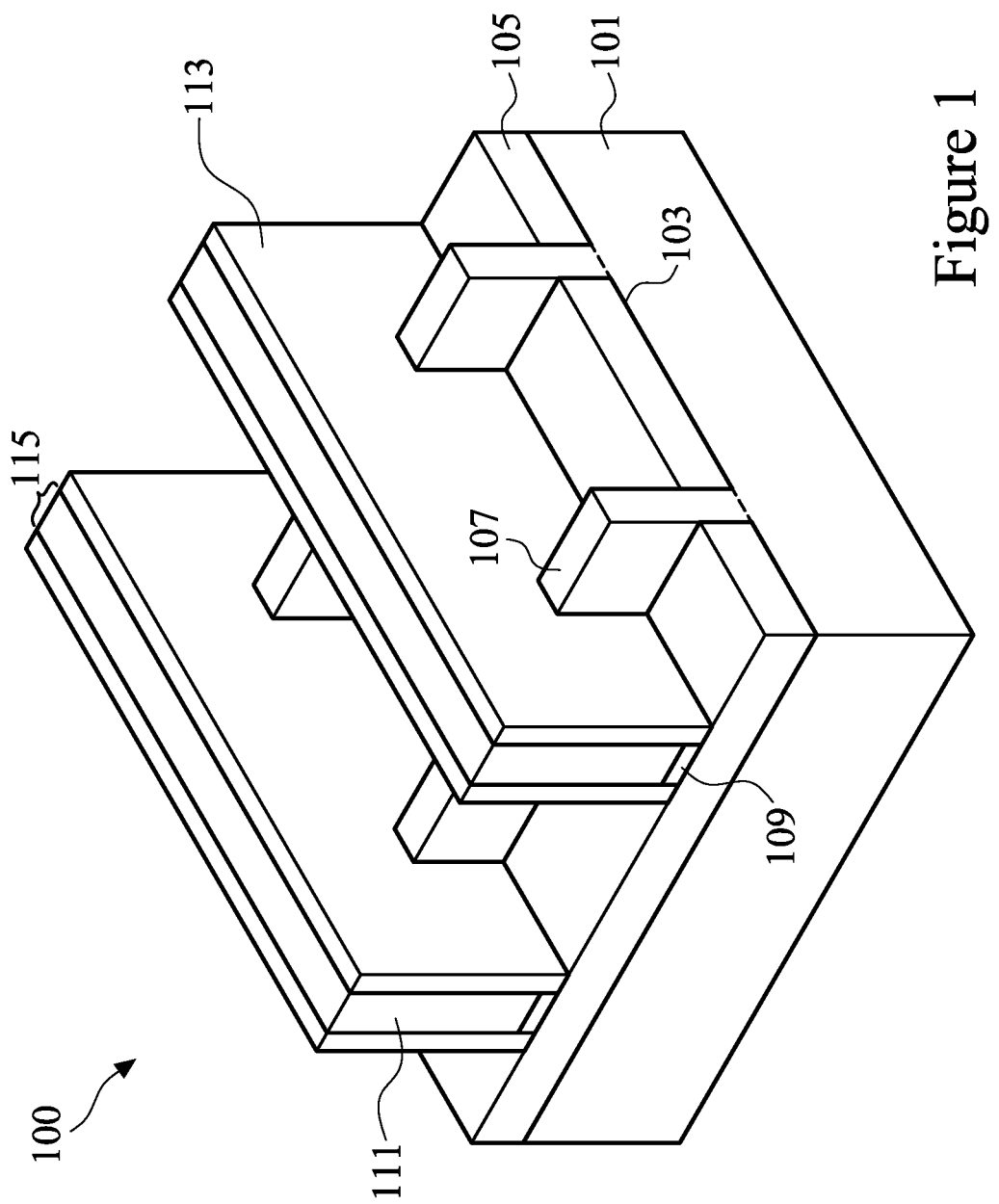
FIG. 1 illustrates a perspective view of a formation of semiconductor fins, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular examples including finFET manufacturing processes with blister prevention and semiconductor devices formed with a reduced number of blisters. However, embodiments are not limited to the examples provided herein, and the ideas may be implemented in a wide array of embodiments.

With reference now to FIG. 1, there is illustrated a perspective view of a semiconductor device 100 such as a finFET device. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates two fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive or non-conductive material and may be selected from a group comprising polysilicon, W, Al, Cu, AlCu, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a thickness of between about 5 Å and about 500 Å. Additionally, once the first spacers 113 have been formed, a first spacer 113 adjacent to one stack 115 may be separated from a first spacer 113 adjacent to another stack 115 by a distance of between about 5 nm and about 200 nm, such as about 20 nm. However, any suitable thicknesses and distances may be utilized.

Figure 2A:
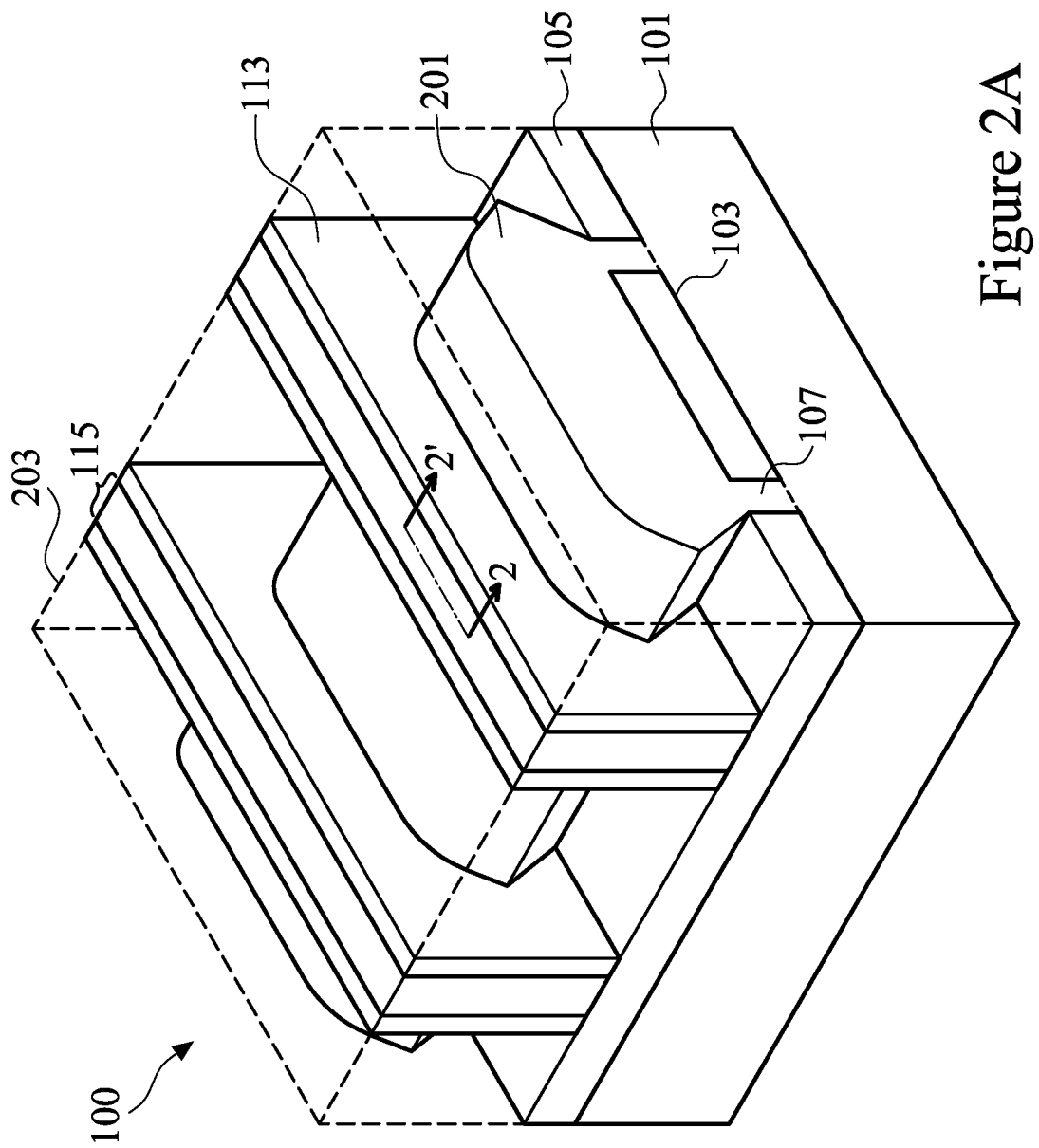
FIGS. 2A-2B illustrate formation of source/drain regions and a removal of a dummy gate electrode, in accordance with some embodiments.
Figure 2B:
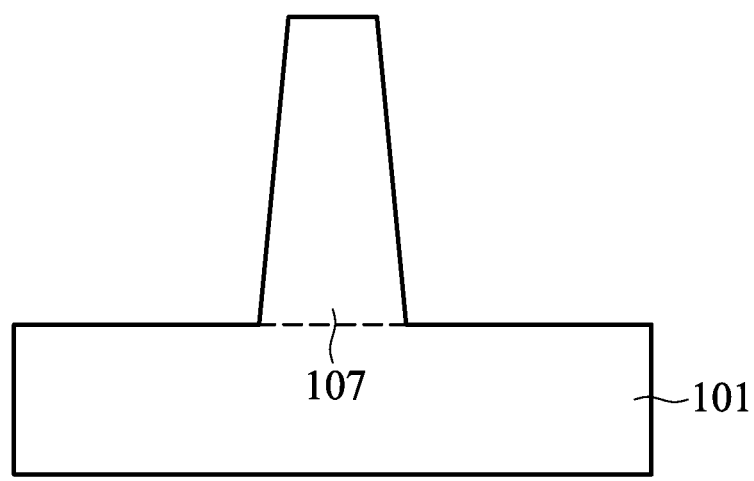

FIGS. 2A-2B illustrates a removal of the fins 107 from those areas not protected by the stacks 115 and the first spacers 113 and a regrowth of source/drain regions 201, with FIG. 2B illustrating a cross-sectional view of a single fin 107 along line 2-2' of FIG. 2A after removal of the dummy gate dielectric 109 and the dummy gate electrode 111. The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å and a height over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2A also illustrates a formation of an inter-layer dielectric (ILD) layer 203 (illustrated in dashed lines in FIG. 2A in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

FIGS. 2A-2B further illustrate further processing of a removal and replacement of the material of the dummy gate electrode 111 and the dummy gate dielectric 109. In an embodiment the dummy gate electrode 111 and the dummy gate dielectric 109 may be removed using, e.g., one or more wet or dry etching processes that utilize etchants that are selective to the materials of the dummy gate electrode 111 and the dummy gate dielectric 109. However, any suitable removal process or processes may be utilized.

Figure 3:
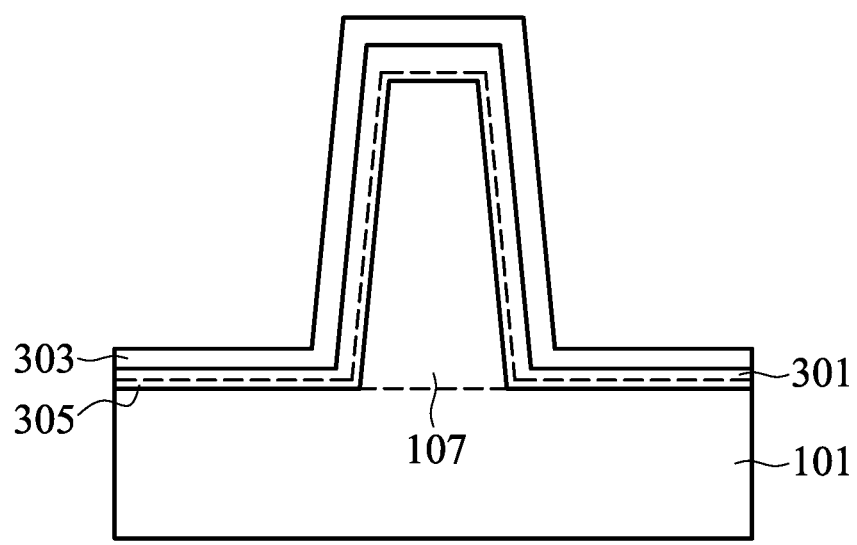
FIG. 3 illustrates formation of a first dielectric layer and a work function layer in accordance with some embodiments.

FIG. 3 illustrates that, once the dummy gate electrode 111 and the dummy gate dielectric 109 have been removed, a process to form a first gate stack 503 (not illustrated in FIG. 3 but illustrated below with respect to FIG. 5) may be begun by depositing a series of layers. In an embodiment the series of layers may include an optional interfacial layer 305 (represented in FIG. 3 by the dashed line), a first dielectric layer 301, and a first p-metal work function layer 303.

The optional interfacial layer 305 may be formed prior to the formation of the first dielectric layer 301. In an embodiment the interfacial layer 305 may be a material such as silicon dioxide formed through a process such as in situ steam generation (ISSG). In another embodiment the interfacial layer 305 may be a high-k material such as $HfO_2$, HfSiO, HfSiON, HfTaO, HfTiO, HfZrO, LaO, ZrO, $Ta_2O_5$, combinations of these, or the like, to a thickness of between about 5 Å and about 20 Å, such as about 10 Å. However, any suitable material or process of formation may be utilized.

Once the interfacial layer 305 is formed, the first dielectric layer 301 may be formed over the interfacial layer 305. In an embodiment the first dielectric layer 301 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric layer 301 may be deposited to a thickness of between about 5 Å and about 200 Å, such as about 12 Å, although any suitable material and thickness may be utilized.

The first metal work function layer 303 may be formed over the first dielectric layer 301. In an embodiment, the first metal work function layer 303 may be formed from a metallic material such as TiN, Al, LaO, Ti, TiAlN, TaC, TaCN, TaSiN, TaSi$_2$, NiSi$_2$, Mn, Zr, ZrSi$_2$, TaN, Ru, Mo, MoSi$_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first p-metal work function layer 303 may be deposited using a deposition process such as atomic layer deposition, chemical vapor deposition, sputtering, or the like, to a thickness of between about 5 Å and about 50 Å, such as about 12 Å, although any suitable deposition process or thickness may be used.

Additionally, in other particular embodiments, the first metal work function layer 303 may comprise multiple layers of materials, instead of being a single layer of a single material. For example, in some embodiments the first metal work function layer 303 may comprise a first layer of a material such as aluminum and also comprise a second layer of a material such as titanium nitride. However, any suitable number of layers and any suitable combination of materials may be utilized and all such combinations are fully intended to be included within the scope of the embodiments.

Figure 4:
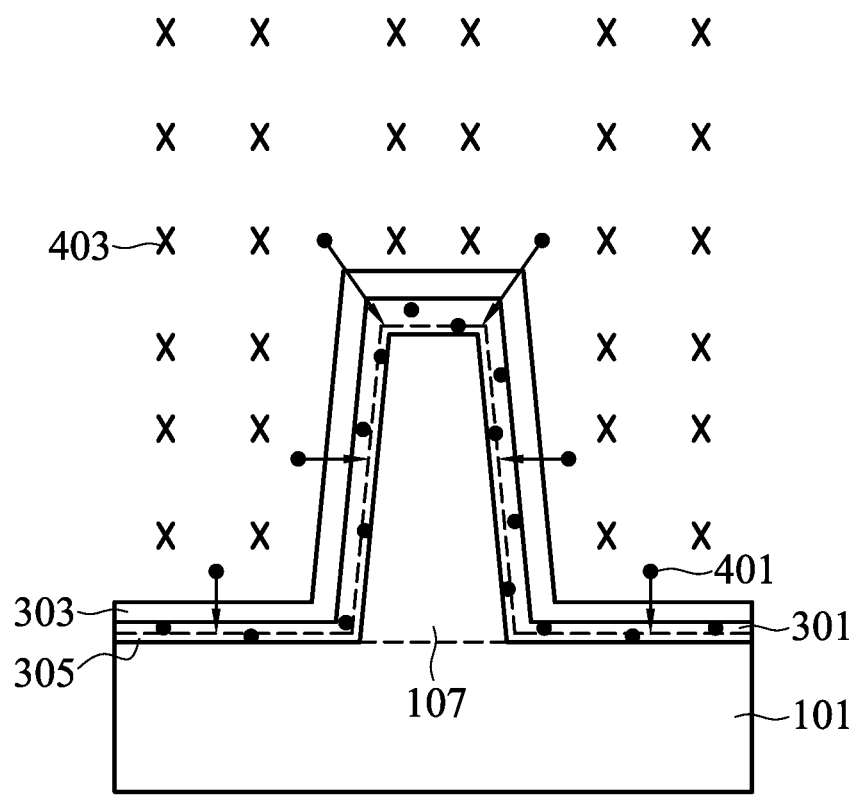
FIG. 4 illustrates a soaking process in accordance with some embodiments.

FIG. 4 illustrates that, once the first metal work function layer 303 has been deposited, a passivation dopant (represented in FIG. 4 by the dots labeled 401) may be introduced into the first dielectric layer 301 and, optionally, the interfacial layer 305, through the first metal work function layer 303. Such an introduction of the passivation dopant 401 helps to passivate electrical trapping defects within the first dielectric layer 301 and/or the interfacial layer 305.

In an embodiment the passivation dopant 401 may be an atom or molecule that is able to diffuse through the first metal work function layer 303 and into and/or through the first dielectric layer 301 and interfacial layer 305 and is also able to passivate defects within the material of the first dielectric layer 301 and the material of the interfacial layer 305. In a particular embodiment the passivation dopant 401 may be an atom such as fluorine, nitrogen, hydrogen, chlorine, combinations of these, or the like. However, any suitable atom or molecular may be utilized.

In order to introduce the passivation dopant 401 into the first dielectric layer 301 and/or the interfacial layer 305, a soaking process utilizing precursors (represented in FIG. 4 by the "X"s labeled 403) may be utilized. In such a soaking process the precursors 403 of the passivation dopant 401 may be introduced to a chamber into which the structure including the first metal work function layer 303 is placed, and flow rates, diffusion and chemical reactions work to move the passivation dopant 401 to enter and pass through the first metal work function layer 303, into the first dielectric layer 301, and, in some embodiments, into the interfacial layer 305. However, any suitable method of introducing the precursor 403 may be utilized.

In some embodiments the precursor 403 is one or more molecules which comprise the desired passivation dopant 401 (e.g., fluorine) and which also does not significantly react with the material of the first metal work function layer 303. As such, while the precise precursor 403 chosen is dependent at least in part on the precise material chosen for the passivation dopant 401 and the precise material chosen for the first metal work function layer 303, in an embodiment in which the passivation dopant 401 is fluorine and the material of the first metal work function layer 303 is titanium nitride, the precursor 403 may be a fluorine containing precursor such as nitrogen trifluoride (NF$_3$), fluorine (F$_2$), combinations of these, or the like. However, any other suitable precursor that is suitable for the chosen dopants, such as precursors like nitrogen (N$_2$), ammonia (NH$_3$), hydrogen (H$_2$), chlorine (Cl$_2$), combinations of these, or the like, may be utilized.

In an embodiment the precursor 403 may be introduced to the first metal work function layer 303 at a flow rate that allows fresh amounts of the precursor 403 to make up any reduction in concentration in the chamber that occurs as previously introduced precursor 403 diffuses into the first metal work function layer 303 and/or reacts. For example, the precursor 403 may be introduced at a flow rate of between about 0.2 liter per minute and about 1.8 liters per minute, such as about 1 liters per minute. However, any suitable flow rate may be utilized.

Additionally, in some embodiments the precursor 403 may be introduced along with a diluent or carrier gas in order to make the transportation and control of the precursor 403 easier. In an embodiment in which nitrogen trifluoride is utilized as the precursor 403, a diluent such as nitrogen, hydrogen, or argon may also be introduced into the chamber. In an embodiment the diluent may be introduced at a flow rate of between about 1 liter and about 6 liters per minute. However, any suitable flow rate may be utilized.

The introduction of the precursor 403 may be performed at process conditions that ensure that the desired diffusions and reactions (described further below) occur without other, undesirable reactions and processes occurring. For example, in some embodiment the introduction may be performed at a temperature of less than 600° C., such as between about 250° C. and 350° C., in order to speed up the diffusion process while still preventing undesired reactions of the precursors and diluents (e.g., undesired reactions between the nitrogen trifluoride and the nitrogen). Similarly, the process may be performed at a pressure below about 1 torr, such as between about 0.4 torr and about 0.5 torr. However, any suitable process conditions may be utilized.

During the soaking process, the precursor 403 will diffuse into the first metal work function layer 303, through the first metal work function layer 303, and into at least the first dielectric layer 301 and, in some embodiments, into the interfacial layer 305. Once within the first dielectric layer 301 or the interfacial layer 305, the precursor 403 will react with open sites and/or dangling bonds within the first dielectric layer 301, thereby bonding the passivation dopant 401 (e.g., fluorine) with the material of the first dielectric layer 301 and passivating defects within the materials of the first dielectric layer 301 and the interfacial layer 305.

Additionally, once the passivating dopant 401 has reacted to passivate the defects of the first dielectric layer 301 and the interfacial layer 305, remaining portions of the precursor 403 (e.g., the nitrogen in an embodiment in which the precursor is nitrogen trifluoride) will then leave the structure. For example, the remaining portions of the precursor 403 will, once relieved of the passivation dopant 401, diffuse out of the first dielectric layer 301 and interfacial layer 305, out of the first metal work function layer 303, and into the surrounding atmosphere. As such, only the passivation dopant 401 remains within the structure, and the remaining portion of the precursor 403 degasses out of the structure.

The soaking process may be continued for a time sufficient to diffuse the passivation dopants 401 through the first metal work function layer 303, into the first dielectric layer 301 and, in some embodiments, into the interfacial layer 305 and for a time sufficient to allow the reaction and subsequent degassing of the precursor 403. In an embodiment the process may be continued for a time of between about 10 minutes and about 2 hours, such as about 1 hour. However, any suitable time may be utilized.

By utilizing a thermal soaking process as described herein, a more conformal implantation of the passivation dopant 401 may be achieved over other methods. For example, by soaking the first metal work function layer 303 in an environment with an almost constant concentration of the precursor 403 (due to, e.g., the constant flow and its associated mixing of the precursor 403), the precursor 403 will diffuse into the first metal work function layer 303 from all directions. Such a diffusion from each direction creates a much more conformal dispersion of the passivation dopant 401 within the first dielectric layer 301 than other, more directional implantation methods such as an ion implantation process. With more control, a larger window of manufacture can be obtained, thereby improving the overall process.

Additionally, by utilizing the precursor 403 described herein, less damage from undesired chemical reactions can occur during the implantation. For example, in other processes which use heavily reactive species such as diatomic fluorine ($F_2$), larger times are utilized in order to ensure a sufficient incorporation of the passivation dopant 401, and during the longer process times, the fluorine will undesirably react with the material of the first metal work function layer 303, potentially leading to an undesired etching away of the material of the first metal work function layer 303. By utilizing a less reactive precursor 403 which will not significantly react with the material of the first p-metal work function layer 303, the material of the first metal work function layer 303 will remain intact, and the first p-metal work function layer 303 will remain at the same thickness both before and after the introduction of the precursors 403.

Figure 5:
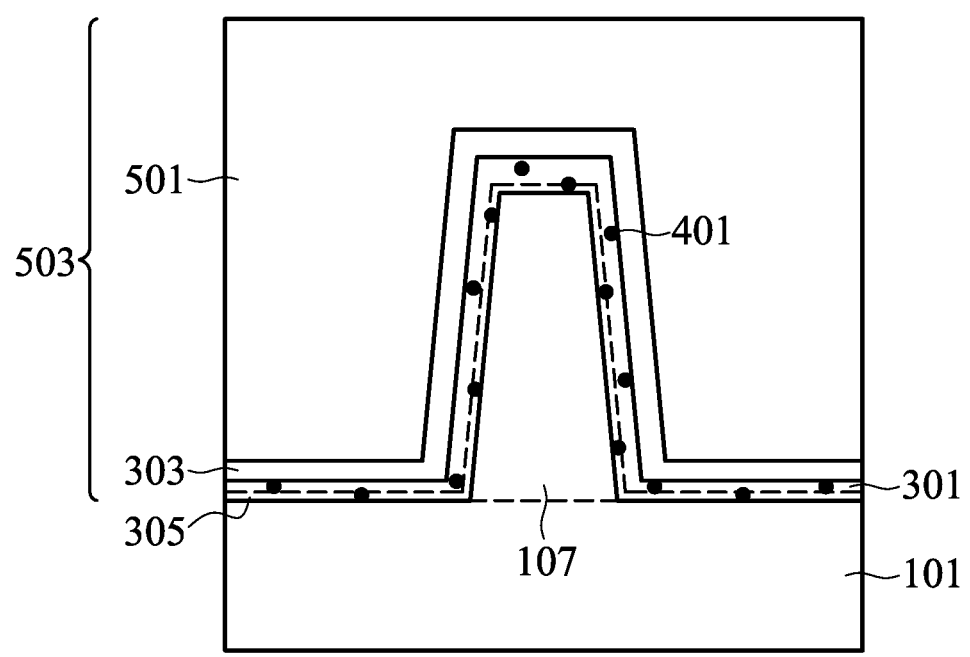
FIG. 5 illustrates formation of a fill material, in accordance with some embodiments.
Figure 6:
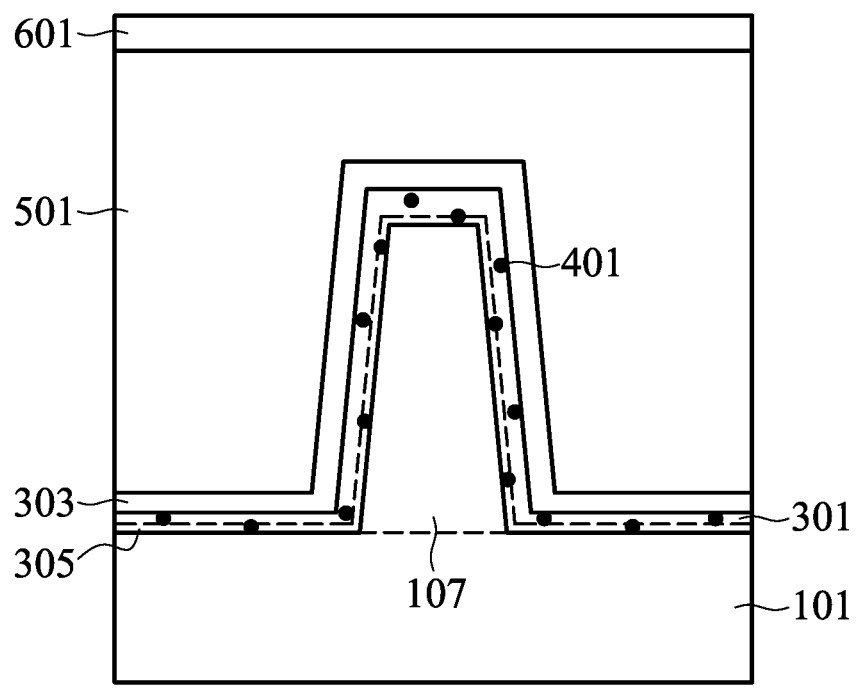
FIG. 6 illustrates formation of a cap, in accordance with some embodiments.

FIG. 5 illustrates that once the passivation dopant 401 has been introduced, a glue layer (not separately illustrated) and a fill material 501 may be formed. In an embodiment the glue layer may be formed in order to help adhere the overlying fill material 501 with the underlying materials as well as provide a nucleation layer for the formation of the fill material 501. In an embodiment the glue layer may be a material such as titanium nitride and may be formed using a similar process such as ALD to a thickness of between about 10 Å and about 100 Å, such as about 50 Å. However, any suitable materials and processes may be utilized.

Once the glue layer has been formed, the fill material 501 is deposited to fill a remainder of the opening using the glue layer. In an embodiment the fill material 501 may be a material such as Al, Cu, AlCu, W, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. Additionally, the fill material 501 may be deposited to a thickness of between about 1000 Å and about 2000 Å, such as about 1500 Å. However, any suitable material may be utilized.

FIG. 5 also illustrates that, after the fill material 501 has been deposited to fill and overfill the opening, the fill material 501 may be planarized to form a first gate stack 503. In an embodiment the materials may be planarized with the first spacers 113 (see FIG. 1) using, e.g., a chemical mechanical polishing process, although any suitable process, such as grinding or etching, may be utilized.

After the materials of the first gate stack 503 have been formed and planarized, the materials of the first gate stack 503 may be recessed and capped with a capping layer 601. In an embodiment the materials of the first gate stack 503 may be recessed using, e.g., a wet or dry etching process that utilizes etchants selective to the materials of the first gate stack 503. In an embodiment the materials of the first gate stack 503 may be recessed a distance of between about 5 nm and about 150 nm, such as about 120 nm. However, any suitable process and distance may be utilized.

Once the materials of the first gate stack 503 have been recessed, the capping layer 601 may be deposited and planarized with the first spacers 113. In an embodiment the capping layer 601 is a material such as SiN, SiON, SiCON, SiC, SiOC, combinations of these, or the like, deposited using a deposition process such as atomic layer deposition, chemical vapor deposition, sputtering, or the like. The capping layer 601 may be deposited to a thickness of between about 5 Å and about 200 Å, and then planarized using a planarization process such as chemical mechanical polishing such that the capping layer 601 is planar with the first spacers 113.

Figure 7:
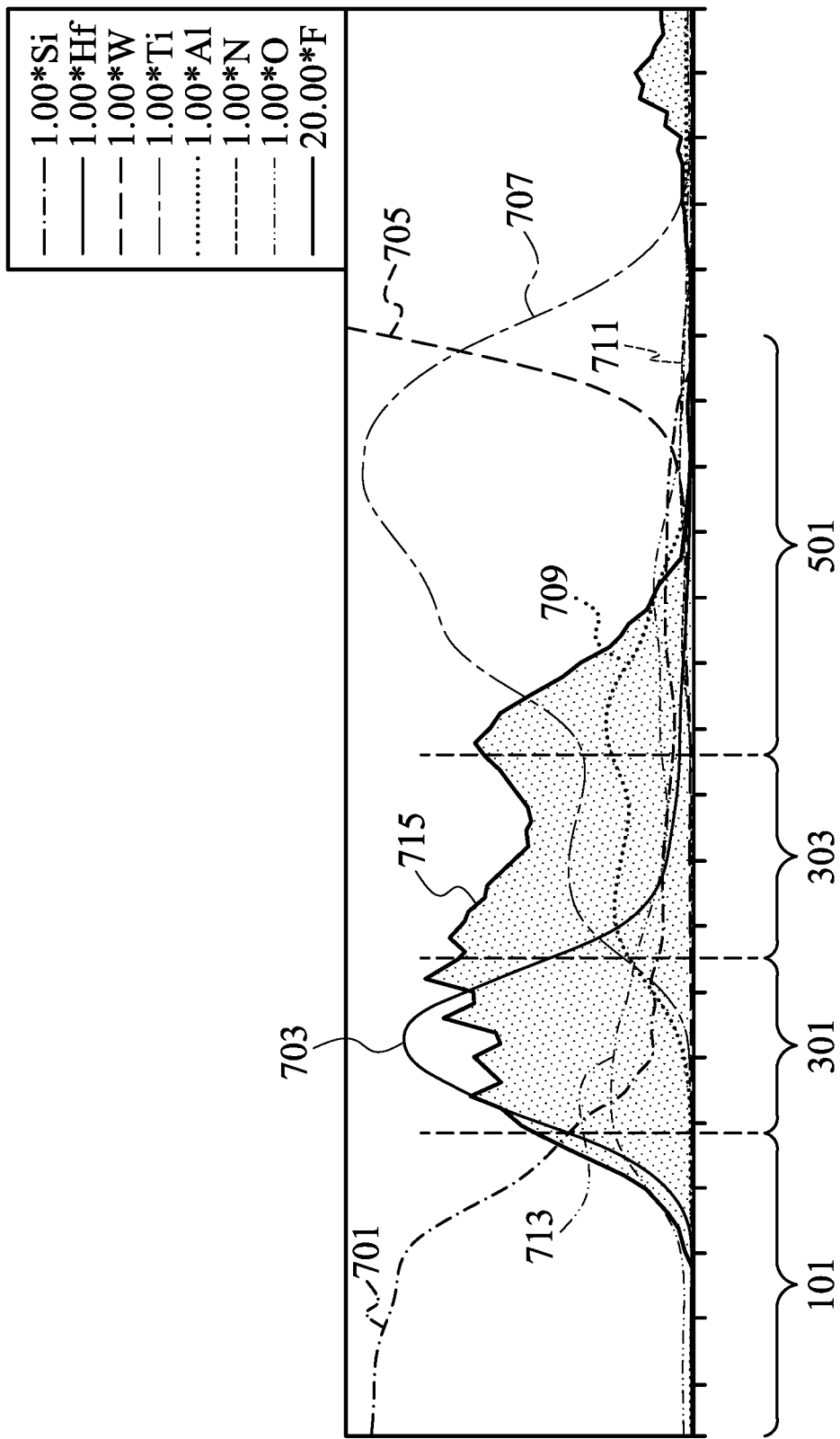
FIG. 7 illustrates a first scan of fluorine concentrations, in accordance with some embodiments.

FIG. 7 illustrates an energy dispersive spectroscopy chart of the various atoms within the substrate 101, the first dielectric layer 301, the first metal work function layer 303, and the fill material 501 in one particular embodiment. In preparation for the scan of this embodiment, the thermal soak was performed at a flow rate of 1 L/min, a temperature of 300° C., a pressure of 100 pa, and a time of 1 hr. Additionally, in this embodiment the first metal work function layer 303 comprises multiple layers of multiple materials, such as a first layer of aluminum followed by a second layer of titanium nitride. In this scan, line 701 represents the concentration of silicon, line 703 represents the concentration of hafnium, line 705 represents the concentration of tungsten, line 707 represents the concentration of titanium, line 709 represents the concentration of aluminum, line 711 represents the concentration of nitrogen, and line 713 represents the concentration of oxygen. Additionally, the background chart 715 represents the concentration of fluorine.

As can be seen, the concentration of the passivation dopant 401 fluorine is at a maximum within the first dielectric layer 301 and reduces in concentration from this maximum in both directions. Additionally, the concentration of fluorine will also decrease and then increase within the first metal work function layer 303 given the multiple layers of different material that are present in this embodiment.

Figure 8:
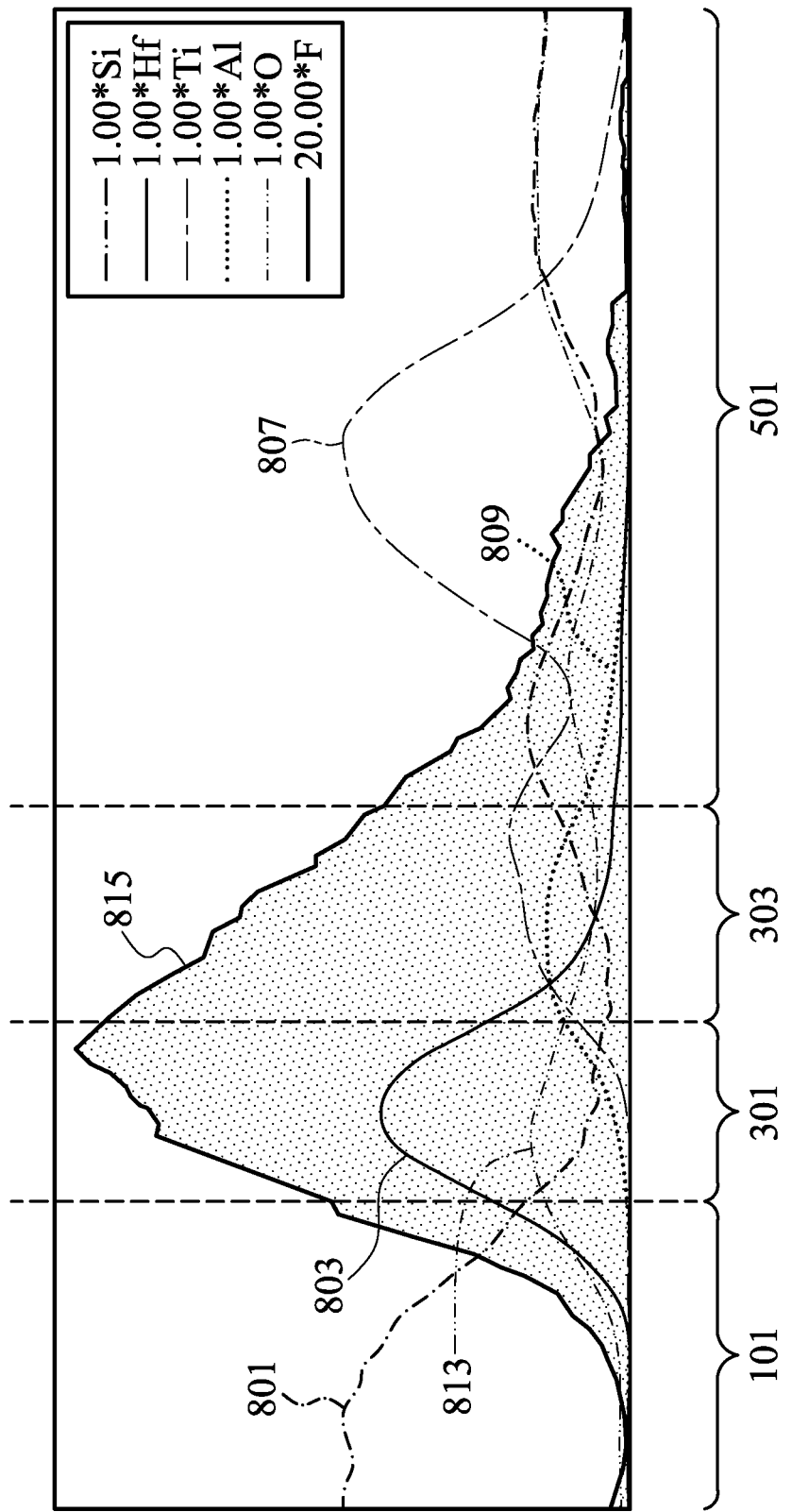
FIG. 8 illustrates a second scan of fluorine concentrations, in accordance with some embodiments.

FIG. 8 illustrates an energy dispersive spectroscopy chart of the various atoms within the substrate 101, the first dielectric layer 301, the first metal work function layer 303, and the fill material 501 for another embodiment. In preparation for the scan of FIG. 8, the thermal soak was performed at a flow rate of 1.5 L/min, a temperature of 350° C., a pressure of 100 pa, and a time of 1 hr. Additionally, in this embodiment the first metal work function layer 303 comprises a single layer of material such as TiN. In this scan, line 801 represents the concentration of silicon, line 803 represents the concentration of hafnium, line 807 represents the concentration of titanium, line 809 represents the concentration of aluminum, and line 813 represents the concentration of oxygen. Additionally, the background chart 815 represents the concentration of fluorine.

As can be seen, the concentration of the passivation dopant 401 fluorine is at a maximum within the first dielectric layer 301 and reduces in concentration from this maximum in both directions. Additionally, the concentration of fluorine will also continuously decrease through the first metal work function layer 303 and into the fill material 501.

By utilizing the thermal soak as described herein a more conformal introduction of the passivation dopant 401 may be made into the first dielectric layer 301. Additionally, by utilizing precursors which do not substantially react with the material of the first metal work function layer 303, the conformal introduction can be made without excessive etching and degradation of the first metal work function layer 303. As such, more control over the process may be achieved, allowing for a larger operating window.

In an embodiment a method of manufacturing a semiconductor device includes: forming a gate dielectric layer over a semiconductor fin; forming a first work function layer over the gate dielectric layer, the first work function layer having a first thickness after the forming the first work function layer; soaking the first work function layer in a first precursor, the first precursor comprising a passivation dopant, wherein the soaking the first work function layer introduces the passivation dopant into the gate dielectric layer and wherein the first work function layer has the first thickness after the soaking the first work function layer; and forming a fill material over the first work function layer. In an embodiment the passivation dopant is fluorine. In an embodiment the passivation dopant containing precursor is nitrogen trifluoride. In an embodiment the soaking the gate dielectric is performed at a temperature of less than 600° C. In an embodiment the soaking the gate dielectric is performed at a temperature of between about 250° C. and about 350° C. In an embodiment the nitrogen trifluoride is introduced at a flow rate of between about 1 liter per minute and about 1.8 liters per minute. In an embodiment the first work function layer comprises titanium nitride.

In another embodiment, a method of manufacturing a semiconductor device includes: depositing a first work function metal to a first thickness over a high-k dielectric over a semiconductor fin; conformally diffusing fluorine into an interfacial oxide through the high-k dielectric and through the first work function metal by soaking the first work function metal in nitrogen trifluoride, wherein the first work function metal has the first thickness after the conformally diffusing the fluorine; and depositing a fill material after the conformally diffusing the fluorine. In an embodiment the soaking the first work function metal comprises flowing the nitrogen trifluoride at a flow rate of between about 1 liter per minute and about 1.8 liters per minute. In an embodiment the soaking the first work function metal comprises flowing nitrogen at a flow rate of between about 1 liter per minute and about 6 liters per minute. In an embodiment the soaking the first work function metal is performed at a temperature of between about 250° C. and about 350° C. In an embodiment the soaking the first work function metal is performed at a pressure of less than about 1 torr. In an embodiment the soaking the first work function metal is performed at a pressure of between about 0.4 torr and about 0.5 torr. In an embodiment the soaking the first work function metal is performed for a time of between about 10 minutes and about 1 hour.

In yet another embodiment, a semiconductor device includes: a semiconductor fin; an interfacial layer over the semiconductor fin; a gate dielectric layer over the interfacial layer; a first work function metal layer over the gate dielectric layer, wherein the first work function metal layer has a first decreasing concentration of fluorine and also has a first increasing concentration of fluorine; and a fill material over the first work function metal layer. In an embodiment the first work function metal layer comprises a first layer of a first material and a second layer of a second material different from the first material. In an embodiment the first material is titanium nitride and the second material is aluminum. In an embodiment the gate dielectric layer comprises hafnium oxide. In an embodiment the first work function metal layer comprises titanium nitride. In an embodiment the interfacial layer comprises silicon oxide and has a decreasing concentration of fluorine.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a gate dielectric layer over a semiconductor fin;
    forming a first work function layer over the gate dielectric layer, the first work function layer having a first thickness after the forming the first work function layer, wherein immediately after the forming the first work function layer the first work function layer has a first exposed surface;
    introducing a first precursor over the semiconductor fin, wherein at the beginning of the introducing, the first exposed surface remains exposed, and wherein the introducing soaks the first exposed surface of the first work function layer in the first precursor, the first precursor comprising a passivation dopant, wherein the soaking the first work function layer introduces the passivation dopant into the gate dielectric layer and wherein the first work function layer has the first thickness after the soaking the first work function layer; and
    forming a fill material over the first work function layer.

2. The method of claim 1, wherein the passivation dopant is fluorine.

3. The method of claim 2, wherein the passivation dopant containing precursor is nitrogen trifluoride.

4. The method of claim 3, wherein the soaking the gate dielectric is performed at a temperature of less than 600° C.

5. The method of claim 4, wherein the soaking the gate dielectric is performed at a temperature of between about 250° C. and about 350° C.

6. The method of claim 5, wherein the nitrogen trifluoride is introduced at a flow rate of between about 1 liter per minute and about 1.8 liters per minute.

7. The method of claim 6, wherein the first work function layer comprises titanium nitride.

8. A method of manufacturing a semiconductor device, the method comprising:
    depositing a first work function metal to a first thickness over a high-k dielectric over a semiconductor fin, the first work function metal having a first exposed surface;
    conformally diffusing fluorine into an interfacial oxide through the high-k dielectric and through the first work function metal by soaking the first work function metal in nitrogen trifluoride, wherein the first work function metal has the first thickness after the conformally diffusing the fluorine, the first exposed surface being exposed at an initiating of the soaking the first work function metal; and
    depositing a fill material after the conformally diffusing the fluorine.

9. The method of claim 8, wherein the soaking the first work function metal comprises flowing the nitrogen trifluoride at a flow rate of between about 1 liter per minute and about 1.8 liters per minute.

10. The method of claim 9, wherein the soaking the first work function metal comprises flowing nitrogen at a flow rate of between about 1 liter per minute and about 6 liters per minute.

11. The method of claim 8, wherein the soaking the first work function metal is performed at a temperature of between about 250° C. and about 350° C.

12. The method of claim 8, wherein the soaking the first work function metal is performed at a pressure of less than about 1 torr.

13. The method of claim 12, wherein the soaking the first work function metal is performed at a pressure of between about 0.4 torr and about 0.5 torr.

14. The method of claim 8, wherein the soaking the first work function metal is performed for a time of between about 10 minutes and about 1 hour, and wherein after the conformally diffusing the fluorine the first work function metal has a first decreasing concentration of fluorine and also has a first increasing concentration of fluorine.

15. A method of manufacturing a semiconductor device, the method comprising:

forming an interfacial layer over a semiconductor fin;

forming a gate dielectric layer over the interfacial layer;

forming a first work function metal layer over the gate dielectric layer, wherein the first work function metal layer has a first decreasing concentration of fluorine and also has a first increasing concentration of fluorine; and forming a fill material over the first work function metal layer.

16. The method of claim 15, wherein the forming the first work function metal layer comprises forming a first layer of a first material and forming a second layer of a second material different from the first material.

17. The method of claim 16, wherein the first material is titanium nitride and the second material is aluminum.

18. The method of claim 15, wherein the forming the gate dielectric layer comprises forming hafnium oxide.

19. The method of claim 15, wherein the forming the first work function metal layer comprises forming titanium nitride.

20. The method of claim 15, wherein the forming the interfacial layer comprises forming silicon oxide with a decreasing concentration of fluorine.

* * * * *